(12) United States Patent
Ahn et al.

(10) Patent No.: US 11,337,347 B2
(45) Date of Patent: May 17, 2022

(54) SYSTEM FOR TRANSFERRING MICRO LED

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 420 days.

(21) Appl. No.: 16/414,521

(22) Filed: May 16, 2019

(65) Prior Publication Data
US 2019/0357395 A1  Nov. 21, 2019

(30) Foreign Application Priority Data

May 16, 2018 (KR) .................. 10-2018-0056013

(51) Int. Cl.
*H05K 13/04* (2006.01)
*H01L 27/32* (2006.01)
*H01L 33/00* (2010.01)
*H01L 33/08* (2010.01)
*H01L 33/36* (2010.01)

(52) U.S. Cl.
CPC ..... *H05K 13/0409* (2018.08); *H01L 27/3272* (2013.01); *H01L 33/005* (2013.01); *H01L 33/08* (2013.01); *H01L 33/36* (2013.01); *Y10T 29/53191* (2015.01)

(58) Field of Classification Search
CPC ..... H05K 13/0409; H01L 33/08; H01L 33/36; H01L 33/486; H01L 25/0753; H01L 27/156; H01L 21/6838; Y10T 29/53191
See application file for complete search history.

(56) References Cited

U.S. PATENT DOCUMENTS

| 8,692,281 B2* | 4/2014 | Su .................. H05K 1/053 257/99 |
| 2011/0036691 A1* | 2/2011 | Steen ............. G02B 6/3538 200/182 |
| 2017/0062393 A1* | 3/2017 | Kim ................. H01L 24/92 |

FOREIGN PATENT DOCUMENTS

| CN | 109637966 A | * | 4/2019 |
| KR | 100731673 B1 | | 6/2007 |
| KR | 20140112486 A | | 9/2014 |
| KR | 20170019415 A | | 2/2017 |
| KR | 20170024906 A | | 3/2017 |
| KR | 20170026959 A | | 3/2017 |
| KR | 101754528 B1 | | 6/2017 |
| KR | 101757404 B1 | | 7/2017 |

OTHER PUBLICATIONS

Saeedi et al., 2007 IEEE 20th International Conference on Micro Electro Mechanical Systems (MEMS), pp. 755-758 (Year: 2007).*

* cited by examiner

*Primary Examiner* — Peter Dungba Vo
*Assistant Examiner* — Jose K Abraham

(57) ABSTRACT

A system for transferring a micro LED includes a micro LED dropped into a solution. The system further includes a micro LED grip body immersed in the solution, the micro LED grip body including a porous member having pores, and gripping the micro LED with a grip surface where the pores are provided. An upper surface of the porous member is configured with a seating recess having a guide inclined portion on which the micro LED is mounted and a shielding portion provided around the seating recess.

12 Claims, 20 Drawing Sheets

SYSTEM FOR TRANSFERRING MICRO LED

CROSS REFERENCE TO RELATED APPLICATION

The present application claims priority to Korean Patent Application No. 10-2018-0056013 filed May 16, 2018, the entire contents of which is incorporated herein for all purposes by this reference.

BACKGROUND OF THE INVENTION

Field of the Invention

The present invention relates to a system for transferring a micro light-emitting diode (micro LED).

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next-generation display. Liquid crystal and organic materials are the core materials of LCDs and OLEDs, respectively, whereas the micro LED display uses 1 μm to 100 μm of an LED chip itself as light emitting material.

Since the term "micro LED" emerged in a patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply the micro LED to a display, it is necessary to develop a customized microchip based on a flexible material and/or flexible device using a micro LED device, and techniques of transferring the micrometer-sized LED chip and mounting the LED chip on a display pixel electrode are required.

Particularly, with regard to the transfer of the micro LED device to a display substrate, as the LED size is reduced to 1 μm to 100 μm, it is impossible to use a conventional pick-and-place machine, and a technology of a transfer head for higher precision is required. With respect to such a technology of a transfer head, several structures have been proposed as described below, but each of the proposed techniques has some problems.

Luxvue Technology Corp., USA, proposed a method of transferring a micro LED using an electrostatic head (Korean Patent Application Publication No. 10-2014-0112486, hereinafter referred to as 'Related Art 2'). A transfer principle of the Related Art 2 is that a voltage is applied to a head portion made of a silicone material so that the head portion comes into close contact with a micro LED due to electrification. However, this method may cause damage to micro LEDs due to electrification caused by the voltage applied to the head portion during induction of static electricity.

X-Celeprint Limited, USA, proposed a method of using an elastic polymer material as a transfer head and transferring a micro LED positioned to a wafer to a desired substrate (Korean Patent Application Publication No. 10-2017-0019415, hereinafter referred to as 'Related Art 3'). According to the Related Art 3, there is no LED damage problem as compared with the above-mentioned electrostatic head case. However, an adhesive force of the elastic transfer head is required to be higher than that of a target substrate in the transfer process to transfer a micro LED stably, and an additional process for forming an electrode is required. In addition, maintaining an adhesive force of the elastic polymer material is an important factor.

Korea Photonics Technology Institute proposed a method of transferring a micro LED using a ciliary adhesive-structured head (Korean Patent No. 10-1754528, hereinafter referred to as 'Related Art 4'). However, in the Related Art 4, it is difficult to manufacture a ciliary adhesive structure.

Korea Institute of Machinery and Materials has proposed a method of transferring a micro LED using a roller coated with an adhesive (Korean Patent No. 10-1757404, hereinafter referred to as 'Related Art 5'). However, the Related Art 5 has a problem in that continuous use of the adhesive is required, and the micro LED may be damaged when pressed with the roller.

Samsung Display Co., Ltd proposed a method of transferring a micro LED to an array substrate according to electrostatic induction by applying a negative voltage to first and second electrodes of the array substrate in a state where the array substrate is immersed in a solution (Korean Patent Application Publication No. 10-2017-0026959, hereinafter referred to as 'Related Art 6'). However, the Related Art 6 has a problem in that a solution is required since the micro LED is immersed in the solution to transfer to the array substrate, and a drying process is required.

LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Related Art 7'). However, the Related Art 7 has a problem in that a process of applying a bonding material to the pick-up heads is required because the bonding material having an adhesive force is required to be applied to bonding surfaces of the multiple pick-up heads to transfer the micro LED.

In order to solve the problems of the related arts described above, it is necessary to solve the above-mentioned problems while adopting the basic principles adopted in the related arts. However, there is a limit to solving the problems because such problems are derived from the basic principles adopted in the related arts. Therefore, applicants of the present invention have not only solved the problems of the related arts but also proposed an advanced method which has not been considered in the related arts.

DOCUMENTS OF RELATED ART (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906.

SUMMARY OF THE INVENTION

Accordingly, the present invention has been made keeping in mind the above problems occurring in the related art, and an objective of the present invention to provide a system for transferring a micro LED, the system transferring more efficiently a micro LED dropped in a solution.

In order to achieve the objective of the present invention, there is provided a system for transferring a micro LED, the system including: a micro LED dropped into a solution; and a micro LED grip body immersed in the solution, including a porous member having pores, and gripping the micro LED with a grip surface where the pores are provided.

In addition, the micro LED grip body may grip the micro LED with a suction force applied to the pores.

In addition, the micro LED grip body may be lifted such that the grip surface is brought into close contact with the micro LED and the micro LED is gripped by the suction force.

In addition, the micro LED dropped in the solution may be lowered by the suction force of the micro LED grip body such that the micro LED is attracted to the grip surface of the micro LED grip body.

In addition, the micro LED grip body may be provided with an electroosmotic pump such that the micro LED grip body grips the micro LED according to operation of the electroosmotic pump.

In addition, the electroosmotic pump may include: a first electrode provided on a first surface of the porous member; a second electrode provided on a second surface of the porous member; and a power supply unit connected to the first and second electrodes to apply voltage.

In addition, the electroosmotic pump may generate a flow in which the solution flows into the porous member, thereby attracting the micro LED to the grip surface of the micro LED grip body.

In addition, the electroosmotic pump may control a flow of an electrolyte filled in the porous member so that the micro LED grip body grips the micro LED.

In addition, the electroosmotic pump may be driven by a pulse wave.

In addition, the pulse wave may be controlled such that a downward force of the solution is larger than an upward force of the solution.

In addition, the porous member may include a porous ceramic.

In addition, the porous member may include an anodic oxide film.

Furthermore, an upper surface of the porous member may be configured with a seating recess having a guide inclined portion on which the micro LED is mounted and a shielding portion provided around the seating recess.

As described above, a system for transferring a micro LED according to the present invention can more efficiently transfer micro LEDs dropped in a solution.

BRIEF DESCRIPTION OF THE DRAWINGS

The above and other objectives, features and other advantages of the present invention will be more clearly understood from the following detailed description when taken in conjunction with the accompanying drawings, in which.

DETAILED DESCRIPTION OF THE INVENTION

Figure 1:
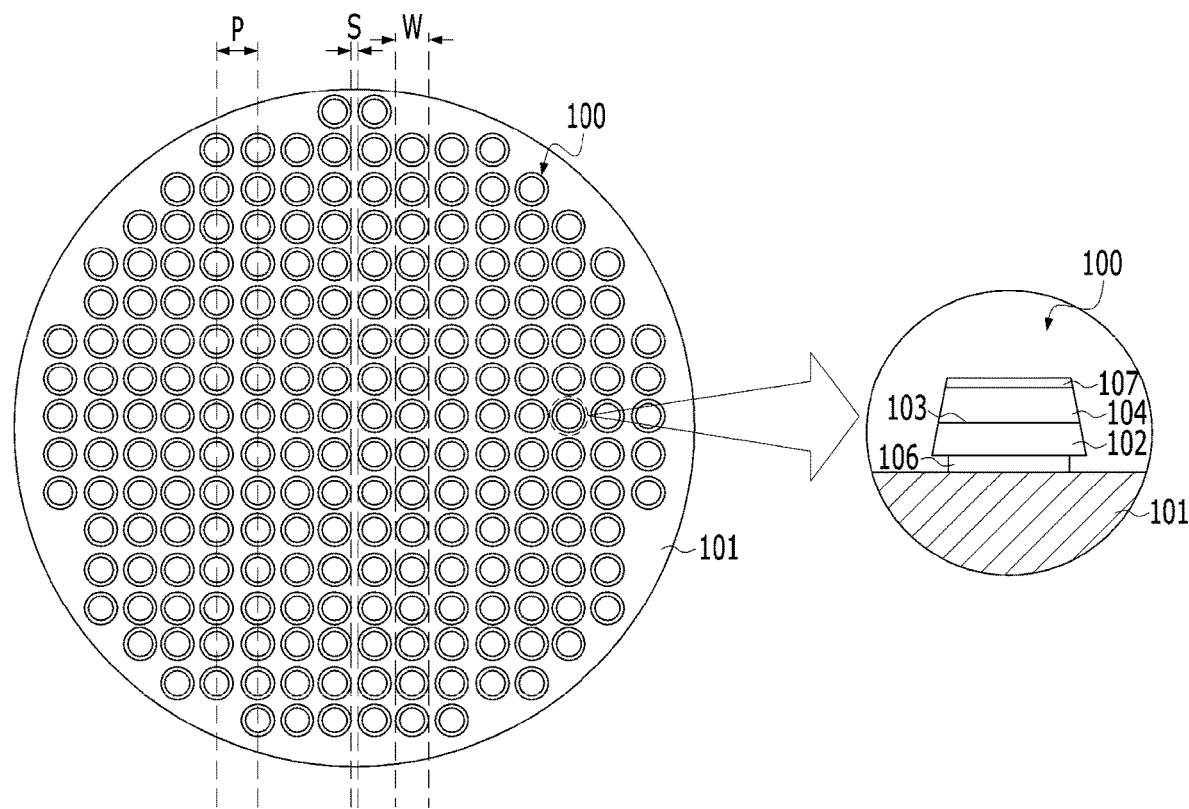
FIG. 1 is a view illustrating micro LEDs to be transferred according to an embodiment of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, embodiments of the present invention will be described in detail with reference to the accompanying drawings.

FIG. 1 is a view illustrating multiple micro LEDs 100 to be transferred by a system for transferring a micro LED according to an embodiment of the present invention. The micro LEDs 100 are fabricated and disposed on a growth substrate 101.

The growth substrate 101 may be formed into a conductive substrate or an insulating substrate. For example, the growth substrate 101 is made of at least one selected from among the group consisting of sapphire, SiC, Si, GaAs, GaN, ZnO, GaP, InP, Ge, and $Ga_2O_3$.

Each of the micro LEDs 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba. The second semiconductor layer 104 may be implemented, for example, as an n-type semiconductor layer. An n-type semiconductor layer may be a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may be implemented as an n-type semiconductor layer, and the second semiconductor layer 104 may be implemented as a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be formed of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include one or more layers and may be made of various conductive materials including a metal, conductive oxide, and conductive polymer.

The multiple micro LEDs 100 formed on the growth substrate 101 are separated into individual pieces by cutting along a cutting line using a laser or the like or by etching. Then, it is possible to separate the individual micro LEDs 100 from the growth substrate 101 by a laser lift-off process.

In FIG. 1, the letter 'P' denotes a pitch distance between the micro LEDs 100, 'S' denotes a separation distance between the micro LEDs 100, and 'W' denotes a width of each micro LED 100.

Figure 2:
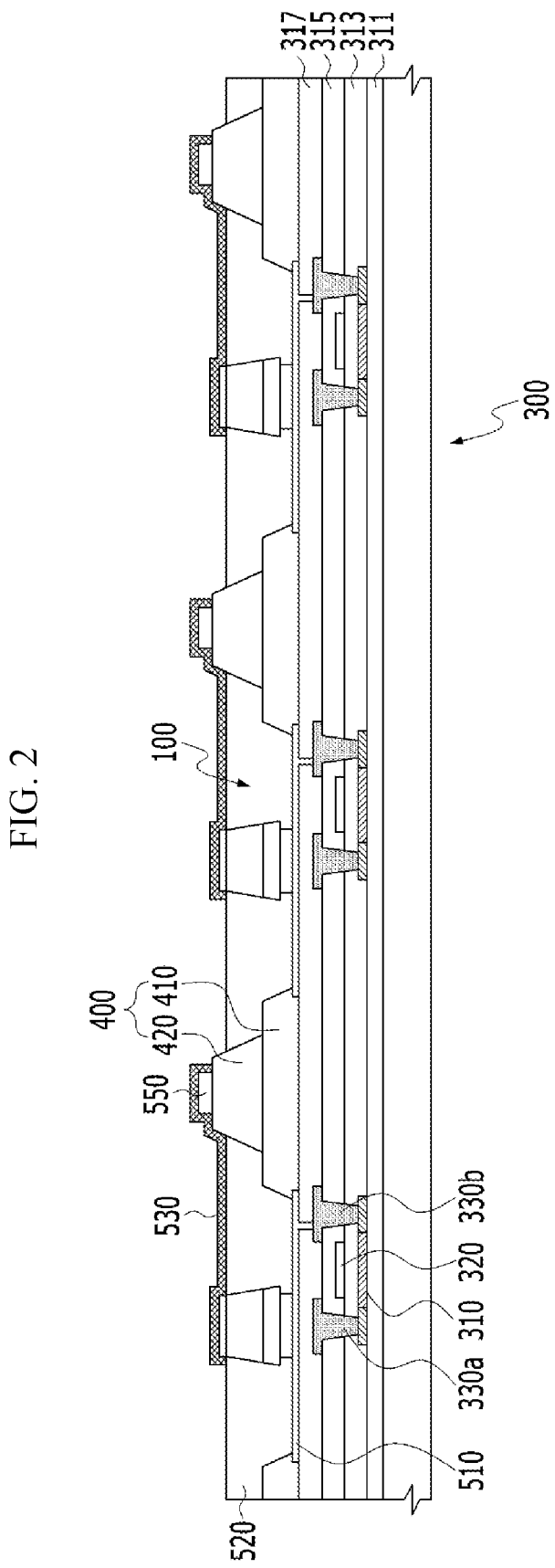
FIG. 2 is a view illustrating a micro LED structure in which the micro LEDs are transferred and mounted to a display substrate according to an embodiment of the present invention.

FIG. 2 is a view illustrating a micro LED structure in which the micro LEDs are transferred and mounted to a display substrate by the system for transferring a micro LED according to the embodiment of the present invention.

A display substrate 300 may include various materials. For example, the display substrate 300 may be made of a transparent glass material having $SiO_2$ as a main component. However, materials of the display substrate 300 are not limited to this, and the display substrate 300 may be made of a transparent plastic material and have solubility. The plastic material may be an organic insulating substance selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the display substrate 300, the display substrate 300 is required to be made of a transparent material. However, in the case of a top emission type in which an image is implemented in a direction opposite to the display substrate 300, the display substrate 300 is not required to be made of a transparent material. In this case, the display substrate 300 may be made of metal.

In the case of forming the display substrate 300 using metal, the display substrate 300 may be made of at least one metal selected from among the group consisting of iron, chromium, manganese, nickel, titanium, molybdenum, stainless steel (SUS), Invar, Inconel, and Kovar, but is not limited thereto.

The display substrate 300 may include a buffer layer 311. The buffer layer 311 provides a flat surface and blocks foreign matter or moisture from penetrating therethrough. For example, the buffer layer 311 may be made of an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various materials. As an alternative embodiment, the active layer 310 may contain an organic semiconductor material or the like.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer 313 is formed on the active layer 310. The gate dielectric layer 313 serves to isolate the active layer 310 and the gate electrode 320. The gate dielectric layer 313 may be formed into a multilayer or a single layer of a film made of an inorganic substance such as silicon oxide and/or silicon nitride.

The gate electrode 320 is provided on the gate dielectric layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a and the drain electrode 330b, and the gate electrode 320. The interlayer dielectric film 315 may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode 330a and the drain electrode 330b are provided on the interlayer dielectric film 315. The source electrode 330a and the drain electrode 330b may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed into a single layer or a multilayer of a film made of an organic substance. The organic substance may include a general-purpose polymer such as polymethyl methacrylate (PMMA) and polystyrene (PS); a polymer derivative having phenols; polyacrylates; polyimides, poly(aryl ethers); polyamides; fluoropolymers; poly-p-xylenes; and polyvinyl alcohols; and a combination thereof. In addition, the planarization layer 317 may be formed into a multi-stack including an inorganic insulating layer and an organic insulating layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes. For example, the first electrode 510 may be patterned in an island layout. A bank layer 400 defining a pixel region may be disposed on the planarization layer 317. The bank layer 400 may include a recess where each of the micro LEDs 100 will be received.

The bank layer 400 may include, for example, a first bank layer 410 defining the recess. A height of the first bank layer 410 may be determined by a height and viewing angle of the micro LED 100. A size (width) of the recess may be determined by resolution, pixel density, and the like, of a display device. In an embodiment, the height of the micro LED 100 may be greater than the height of the first bank layer 410. The recess may have a quadrangular cross section, but is not limited to this. The recess may have various cross-sectional shapes, such as polygonal, rectangular, circular, conical, elliptical, and triangular.

The bank layer 400 may further include a second bank layer 420 on the first bank layer 410. The first bank layer 410 and the second bank layer 420 have a step difference, and a width of the second bank layer 420 may be smaller than the width of the first bank layer 410. A conductive layer 550 may be disposed on the second bank layer 420. The conductive layer 550 may be disposed in a direction parallel to a data line or a scan line, and may be electrically connected to a second electrode 530. However, the present invention is not limited thereto. The second bank layer 420 may be omitted, and the conductive layer 550 may be disposed on the first bank layer 410. Alternatively, the second bank layer 420 and the conductive layer 550 may be omitted, and the second electrode 530 may be formed over the entire display substrate 300 such that the second electrode 530 serves as a shared electrode that pixels (P) share. The first bank layer 410 and the second bank layer 420 may include a material absorbing at least a part of light, a light reflective material, or a light scattering material. The first bank layer 410 and the second bank layer 420 may include an insulating material that is translucent or opaque to visible light (e.g., light in a wavelength range of 380 nm to 750 nm).

For example, the first bank layer 410 and the second bank layer 420 may be made of a thermoplastic such as polycarbonate (PC), polyethylene terephthalate (PET), polyethersulfone, polyvinyl butyral, polyphenylene ether, polyamide, polyetherimide, polynorbornene, poly(methyl methacrylate) resin, and cyclic polyolefin resin, a thermosetting plastic such as epoxy resin, phenolic resin, urethane resin, acrylic resin, vinyl ester resin, polyimide resin, urea resin, and melamine resin, or an organic insulating substance such as polystyrene, polyacrylonitrile, and polycarbonate, but are not limited thereto.

As another example, the first bank layer 410 and the second bank layer 420 may be made of an inorganic insulating substance such as inorganic oxide and inorganic nitride including $SiO_x$, $SiN_x$, $SiN_xO_y$, $AlO_x$, $TiO_x$, $TaO_x$, and $ZnO_x$, but are not limited thereto. In an embodiment, the first bank layer 410 and the second bank layer 420 may be made of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride), or the like. In an alternate embodiment, the first bank layer 410 and the second bank layer 420 may be a distributed Bragg reflector (DBR) having high reflectivity or a mirror reflector made of metal.

The micro LED 100 is disposed in the recess. The micro LED 100 may be electrically connected to the first electrode 510 at the recess.

The micro LED 100 emits light having wavelengths of different colors such as red, green, blue, white, and the like. With the micro LED 100, it is possible to realize white light by using fluorescent materials or by combining colors. The micro LED 100 has a size of 1 μm to 100 μm. The micro LEDs 100 are picked up from the growth substrate 101 individually or collectively by a transfer head according to the embodiment of the present invention, transferred to the display substrate 300, and received in the recess of the display substrate 300.

The micro LED 100 includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may be made of at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED 100 in the recess. The passivation layer 520 covers the recess and the first electrode 510 by filling a space between the bank layer 400 and the micro LED 100. The passivation layer 520 may be made of an organic insulating substance. For example, the passivation layer 520 may be made of acrylic, poly (methyl methacrylate) (PMMA), benzocyclobutene (BCB), polyimide, acrylate, epoxy, and polyester, but is not limited thereto.

The passivation layer 520 is formed to have a height not covering an upper portion of the micro LED 100, for example, a height not covering the second contact electrode 107, whereby the second contact electrode 107 is exposed. The second electrode 530 may be formed on the passivation layer 520 electrically connected to the exposed second contact electrode 107 of the micro LED 100.

The second electrode 530 may be disposed on the micro LED 100 and the passivation layer 520. The second electrode 530 may be made of a transparent conductive substance such as ITO, IZO, ZnO, and $In_2O_3$.

A system for transferring a micro LED according to an embodiment of the present invention includes: micro LEDs dropped in a solution; and a micro LED grip body immersed in the solution, including a porous member having pores, and gripping the micro LEDs with a grip surface where the pores are provided. Hereinbelow, a system for transferring a micro LED according to first and second embodiments of the present invention will be described.

First Embodiment

Hereinbelow, a system for transferring a micro LED according to a first embodiment of the present invention will be described with reference to FIGS. 3A to 6C.

The micro LEDs 100 manufactured on the growth substrate 101 are separated from the growth substrate 101 and then transferred to the display substrate 300 through at least one transfer process.

The micro LEDs 100 manufactured on the growth substrate 101 are dropped in a reservoir containing a solution 2000 before being transferred to the display substrate 300.

The micro LEDs 100 may float in the solution 2000 or sink into the solution 2000 depending on the density difference between the micro LEDs 100 and the solution 2000. The system for transferring a micro LED according to the first embodiment of the present invention includes a structure that can be applied to the system regardless of the density difference between the micro LEDs 100 and the solution 2000 or another structure that can be applied to the system equivalently. As an example for convenience of explanation, it will be described hereinbelow that the micro LEDs 100 float in the solution 2000.

A micro LED grip body 1000 is immersed in the solution 2000. The micro LED grip body 1000 has a porous member 1100 having pores.

The porous member 1100 may be composed of a material containing a large number of pores therein, and may be configured as powders, a thin film, a thick film, or a bulk form having a porosity of about 0.2 to 0.95 in a predetermined arrangement or disordered pore structure. The pores of the porous member 1100 are classified according to pore sizes thereof: micropores having a pore diameter of 2 nm or less, mesopores having a pore diameter of 2 nm to 50 nm, and macropores having a pore diameter of 50 nm or more. The porous member 1100 may include at least some of micropores, mesopores, and macropores. Porous materials of the porous member 1100 are classified according to constituent components thereof: organic, inorganic (ceramic), metal, and hybrid type. The porous member 1100 includes porous ceramics in which pores are not uniformly arranged or includes an anodic oxide film in which pores are formed in a predetermined arrangement. The porous member 1100 is configured as powders, a coating film, or bulk form. The powder may have various shapes such as a sphere, a hollow sphere, a fiber, and a tube. The powder may be used as it is in some cases, but it is also possible to prepare a coating film or a bulk form with the powder as a starting material.

When the pores of the porous member 1100 have a disordered pore structure, the multiple pores are connected to each other inside the porous member 1100 such that flow paths are formed and connect upper and lower portions of the porous member 1100. When the pores of the porous member 1100 have a vertical pore structure, the inside of the porous member 1100 is pierced from top to bottom by the vertical pores such that flow paths are formed.

A shielding portion may be provided on at least a part of a surface of the porous member 1100. The shielding portion is formed to close the pores exposed at least on a part of a surface of the porous member 1100. The shielding portion may be formed on at least a part of upper and lower surfaces of the porous member 1100. In particular, in the case where the porous member 1100 has a disordered pore structure, the shielding portion may be formed on both the upper and lower surfaces of the porous member 1100.

The shielding portion is not limited in material, shape, and thickness as long as the shielding portion functions to close the pores exposed to the surface of the porous member 1100. Preferably, the shielding portion may be further provided and made of a photoresist (PR, including dry film PR) or a metal or may be provided by the structure of the porous member 1100 itself. In the case the shielding portion is provided by the structure of the porous member 1100, for example, in the case the porous member 1100 to be described later is made of an anodic oxide film, the shielding portion may be a barrier layer or a metal base material.

A chamber 1200 is provided below the porous member 1100. The chamber 1200 is connected to a vacuum pump (not illustrated). The chamber 1200 functions to apply a vacuum to the multiple pores of the porous member 1100 or release the vacuum applied to the pores according to the operation of the vacuum pump. A structure of engaging the chamber 1200 with the porous member 1100 is not limited as long as the structure is suitable for preventing gas or air from leaking to other parts when applying the vacuum to the porous member 1100 or releasing the applied vacuum.

When the micro LEDs 100 are brought into close contact with the grip surface of the micro LED grip body 1000, the micro LED grip body 1000 grips the micro LEDs 100 with suction force applied to the pores. When detaching the micro LEDs 100, the vacuum applied to the chamber 1200 is released to remove the vacuum from the multiple pores of the porous member 1100 whereby the grip force to the micro LEDs 100 is removed.

Hereinbelow, the system for transferring a micro LED according to the first embodiment will be described in more detail with reference to FIGS. 3A to 3C.

Figure 3A:
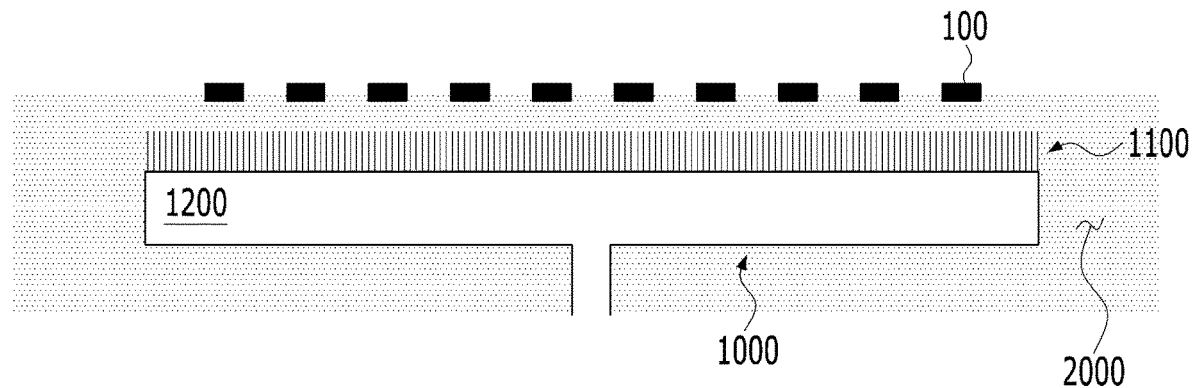
FIGS. 3A to 3C are views illustrating a system for transferring a micro LED according to a first embodiment of the present invention.

As illustrated in FIG. 3A, the micro LEDs 100 manufactured on the growth substrate 101 are dropped into the solution 2000. A pitch distance between the micro LEDs 100 dropped in the solution 2000 may be adjusted by controlling a flow rate of the solution 2000. That is, a pitch distance of the micro LEDs 100 at the time of being manufactured on the growth substrate 101 is adjusted by controlling the flow rate of the solution 2000.

A predetermined air pressure is maintained inside the chamber 1200 of the micro LED grip body 1000 such that it is possible to prevent the solution 2000 from flowing into the chamber 1200 through the pores. It is possible to configure the pore size of the porous member 1100 such that the solution 2000 is prevented from flowing into the chamber 1200 through the pores because of the surface tension on the surface of the micro LED grip body 1000.

Figure 3B:
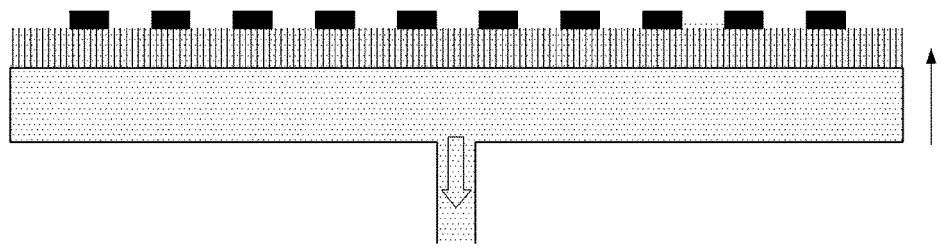

Next, as illustrated in FIG. 3B, the micro LED grip body 1000 is lifted to bring bottom surfaces of the micro LEDs 100 into close contact with the grip surface of the micro LED grip body 1000. Next, the vacuum pump is operated to discharge the air inside the chamber 1200 to the outside through an exhaust unit (not illustrated), whereby the micro LED grip body 1000 grips the micro LEDs 100 with the suction force applied to the pores.

Figure 3C:
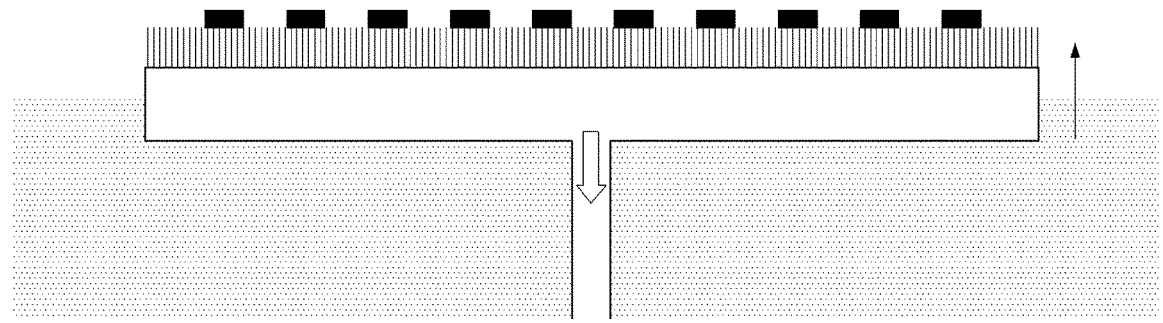

Next, as illustrated in FIG. 3C, the micro LED grip body 1000 is kept lifted up while gripping the micro LEDs 100 in order to expose the micro LEDs 100 to the outside of the solution 2000. The micro LED grip body 1000 grips and holds the micro LEDs 100 using the vacuum suction force until the micro LEDs 100 are transferred to the next process.

Here, some of the solution 2000 on an upper surface of the porous member 1100 may flow into the chamber 1200 due to the suction force, and the solution 2000 flowing into the chamber 1200 is discharged to the outside through a drain part (not illustrated).

Hereinafter, a first modification of the system for transferring a micro LED according to the first embodiment will be described in detail with reference to FIGS. 4A to 4C. The first modification of the system for transferring a micro LED according to the first embodiment differs from the system for transferring a micro LED according to the first embodiment with respect to the configuration. A micro LED grip body 1000 of the first modification of the system according to the first embodiment attracts and grips the micro LEDs 100 floating in the solution 2000, whereas the micro LED grip body 1000 of the system of the first embodiment is lifted and grips the micro LEDs 100.

Figure 4A:
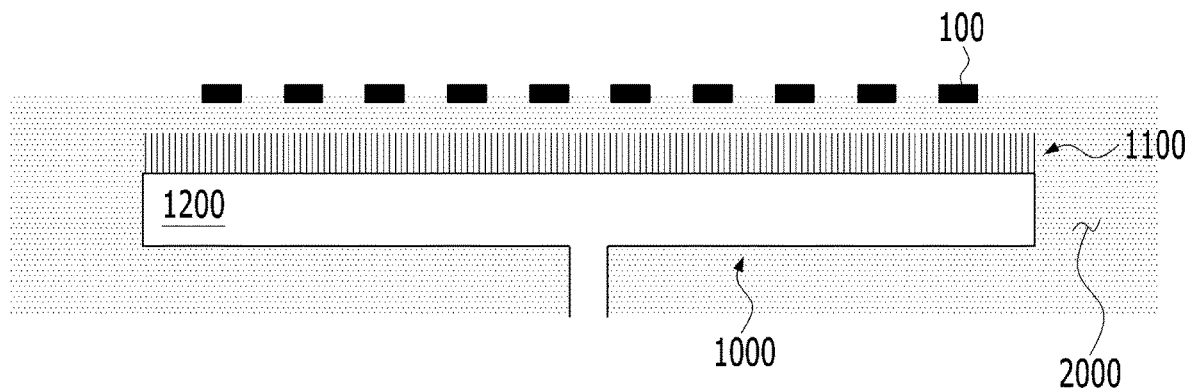
FIGS. 4A to 4C are views illustrating a first modification of the system for transferring a micro LED according to the first embodiment of the present invention.

As illustrated in FIG. 4A, the micro LEDs 100 manufactured on the growth substrate 101 are dropped into the solution 2000. A pitch distance between the micro LEDs 100 dropped in the solution 2000 may be adjusted by controlling a flow rate of the solution 2000.

Figure 4B:
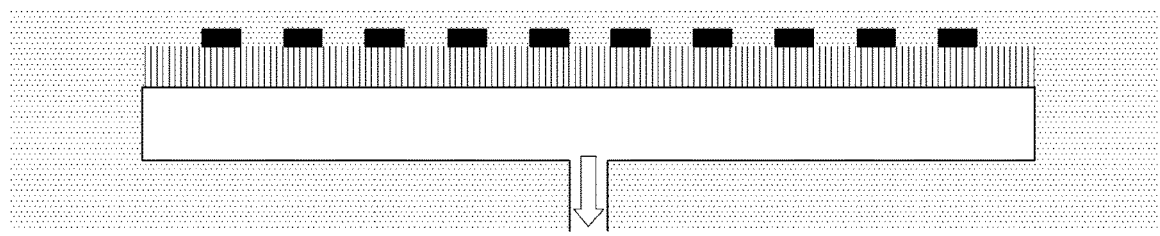

Next, as illustrated in FIG. 4B, the vacuum pump is operated to discharge the inside air to the outside through the chamber 1200 of the micro LED grip body 1000. Accordingly, a downward force is applied to the micro LEDs 100 floating in the solution 2000, and the micro LEDs 100 are attracted to the grip surface of the micro LED grip body 1000 by the downward force. As mentioned above, as the micro LEDs 100 are lowered by the suction force of the micro LED grip body 1000, the micro LEDs 100 are attracted to the grip surface of the micro LED grip body 1000.

After that, the vacuum pump is continuously operated to discharge the inside air to the outside through the chamber 1200, and the grip surface of the micro LED grip body 1000 grips the micro LEDs 100 by vacuum-suction. Here, some of the solution 2000 may flow into the chamber 1200, and the solution 2000 flowing into the chamber 1200 is discharged to the outside through a drain part (not illustrated).

Figure 4C:
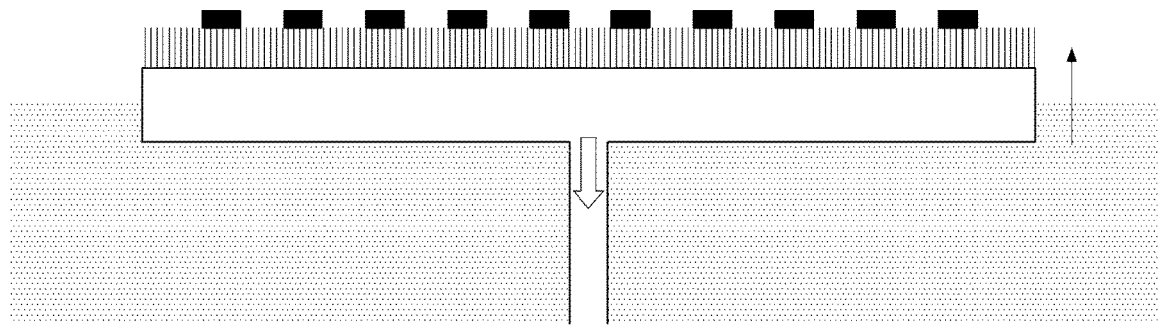

Next, as illustrated in FIG. 4C, while the micro LEDs 100 are gripped by the vacuum suction force applied to the pores of the micro LED grip body 1000, the micro LED grip body 1000 is kept lifted to expose the micro LEDs 100 to the outside of the solution 2000. The micro LED grip body 1000 grips and holds the micro LEDs 100 using the vacuum suction force until the micro LEDs 100 are transferred to the next process.

Hereinafter, a second modification of the system for transferring a micro LED according to the first embodiment will be described in detail with reference to FIGS. 5A to 5C.

Figure 5A:
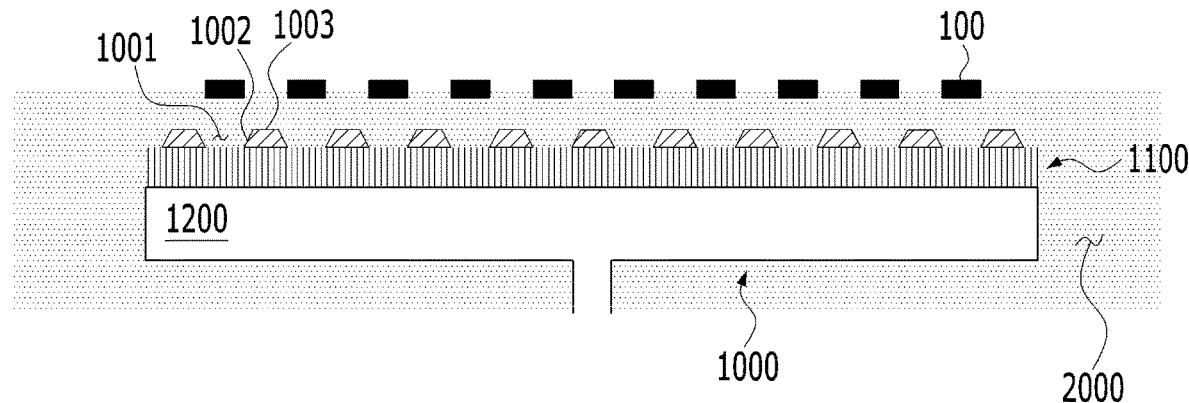
FIGS. 5A to 5C are views illustrating a second modification of the system for transferring a micro LED according to the first embodiment of the present invention.
Figure 5B:
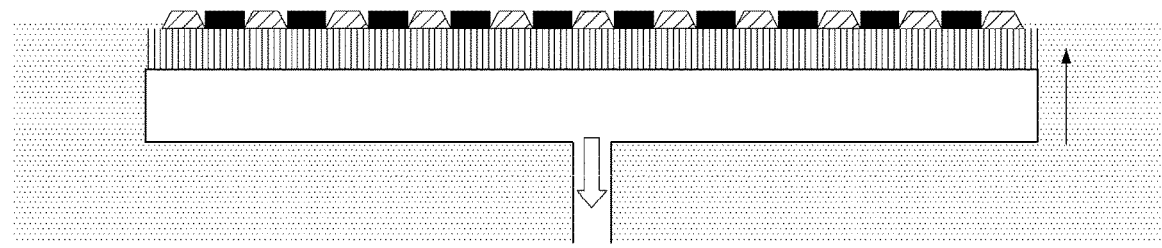
Figure 5C:
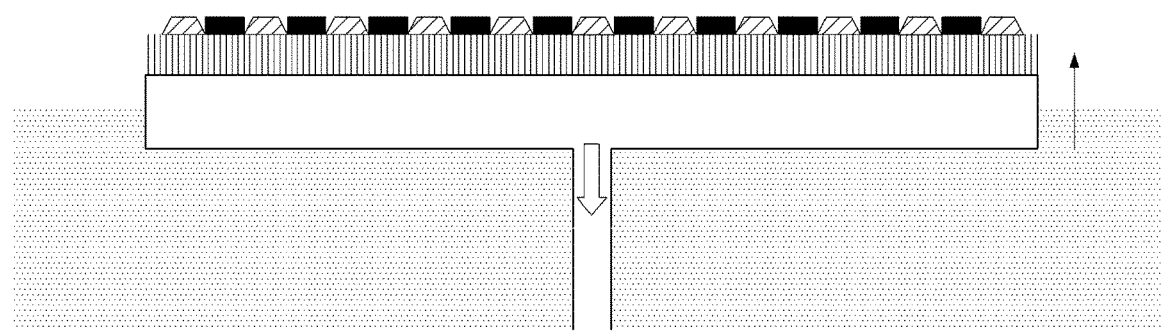

The second modification of the system for transferring a micro LED according to the first embodiment illustrated in FIGS. 5A to 5C differs from the system for transferring a micro LED according to the first embodiment illustrated in FIGS. 3A to 3C with respect to the configuration in which the upper surface of the porous member 1100 is configured with seating recesses 1001 having guide inclined portions 1002 on which the micro LEDs 100 are seated and configured with shielding portions 1003 provided around the seating recesses 1001, but other configurations are the same.

The pores are exposed on a bottom surface of the seating recesses 1001 such that the bottom surface thereof communicate with the inside of the chamber 1200, and the guide inclined portions 1002 are provided at the edges of the seating recesses 1001 to guide the seating of the micro LEDs 100. It is preferable that an inclination angle of the guide inclined portions 1002 is 20° to 40°.

According to the configuration of the guide inclined portions 1002 described above, even when the micro LEDs 100 are seated but slightly misaligned in the seating recesses 1001, the guide inclined portions 1002 serve to guide smooth entry of the micro LEDs 100.

Therefore, even when the micro LEDs 100 dropped in the solution 2000 are disordered, the micro LEDs 100 are arranged as the micro LEDs enter the bottom surface of the seating recesses 1001 through the guide inclined portions 1002. In other words, the seating recesses 1001 having guide inclined portions 1002 serve to arrange the micro LEDs 100.

As illustrated in FIG. 5A, the micro LEDs 100 manufactured on the growth substrate 101 are dropped into the solution 2000. A pitch distance between the micro LEDs 100 dropped in the solution 2000 may be adjusted by controlling a flow rate of the solution 2000.

Next, as illustrated in FIG. 5B, the micro LED grip body 1000 is lifted to allow the micro LEDs 100 to enter into the seating recesses 1001. At this point, the guide inclined portions 1002 of the seating recesses 1001 guide the micro LEDs 100 to enter into the seating recesses 1001, and the micro LEDs 100 that have been disturbed in the solution 2000 are rearranged as the micro LEDs 100 enter into the seating recesses 1001.

Next, as illustrated in FIG. 5C, the micro LED grip body 1000 is kept lifted up while gripping the micro LEDs 100 in order to expose the micro LEDs 100 to the outside of the solution 2000.

Hereinafter, a third modification of the system for transferring a micro LED according to the first embodiment will be described in detail with reference to FIGS. 6A to 6C.

Figure 6A:
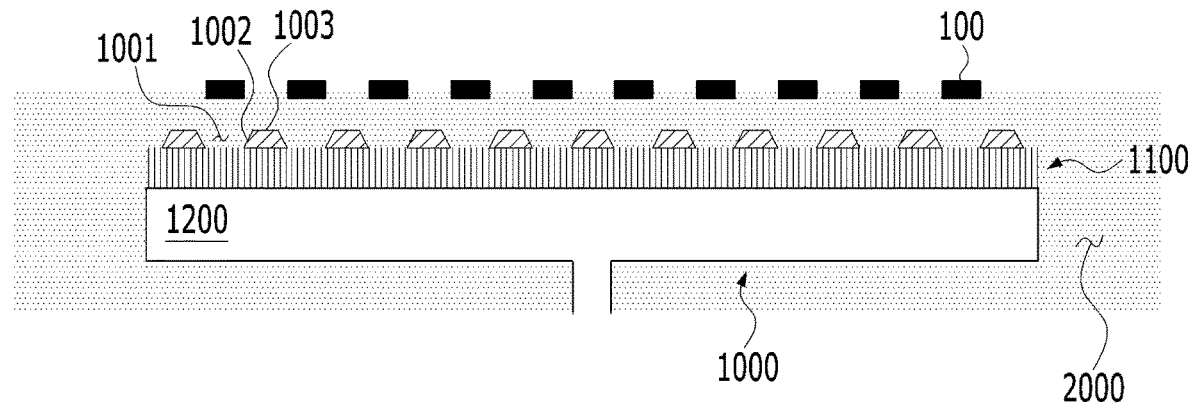
FIGS. 6A to 6C are views illustrating a third modification of the system for transferring a micro LED according to the first embodiment of the present invention.
Figure 6B:
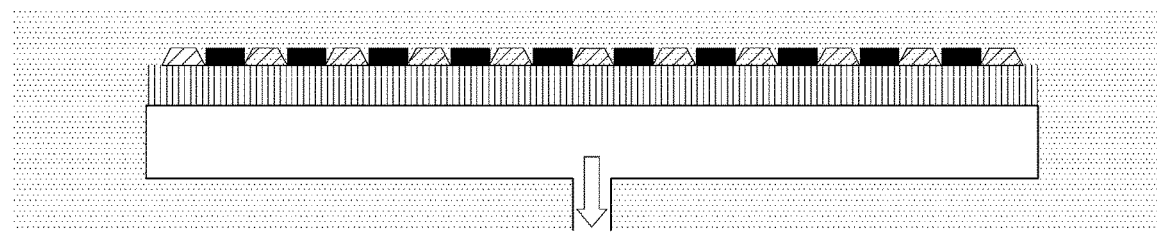
Figure 6C:
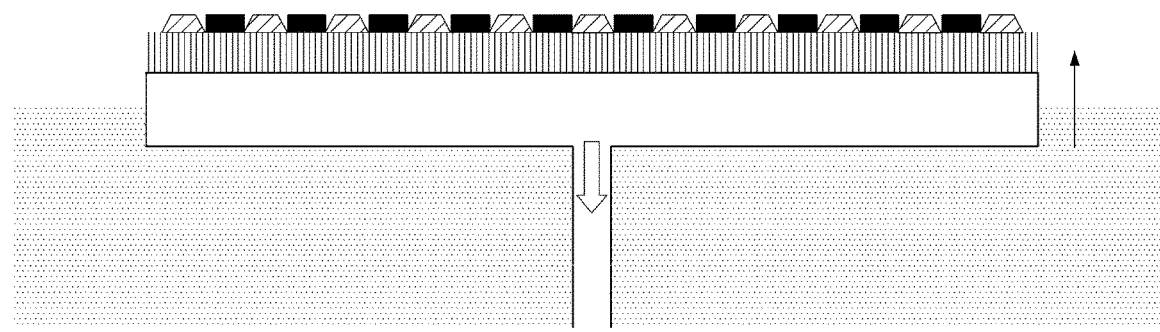

The third modification of the system for transferring a micro LED according to the first embodiment illustrated in FIGS. 6A to 6C differs from the second modification of the system for transferring a micro LED according to the first embodiment illustrated in FIGS. 4A to 4C with respect to the configuration in which the upper surface of the porous member 1100 is configured with seating recesses 1001 having guide inclined portions 1002 on which the micro LEDs 100 are seated and configured with shielding portions 1003 provided around the seating recesses 1001, but other configurations are the same.

As illustrated in FIG. 6A, the micro LEDs 100 manufactured on the growth substrate 101 are dropped into the solution 2000. A pitch distance between the micro LEDs 100 dropped in the solution 2000 may be adjusted by controlling a flow rate of the solution 2000.

Next, as illustrated in FIG. 6B, the inside air is discharged to the outside through the chamber 1200 of the micro LED grip body 1000. Accordingly, a downward force is applied to the micro LEDs 100 floating in the solution 2000, and the micro LEDs 100 are attracted to the grip surface of the micro LED grip body 1000 by the downward force. At this point, the guide inclined portions 1002 of the seating recesses 1001 guide the micro LEDs 100 to enter into the seating recesses 1001, and the micro LEDs 100 that have been disturbed in the solution 2000 are rearranged in a pitch distance of the seating recesses 1001.

After that, the vacuum pump is continuously operated to discharge the inside air to the outside through the chamber 1200, and the grip surface of the micro LED grip body 1000 grips the micro LEDs 100 by vacuum-suction. Here, some of the solution 2000 may flow into the chamber 1200, and the solution 2000 flowing into the chamber 1200 is discharged to the outside through a drain part (not illustrated).

Next, as illustrated in FIG. 6C, while the micro LEDs 100 are gripped by the vacuum suction force applied to the pores of the micro LED grip body 1000, the micro LED grip body 1000 is kept lifted to expose the micro LEDs 100 to the outside of the solution 2000.

Second Embodiment

Hereinbelow, a system for transferring a micro LED according to a second embodiment of the present invention will be described with reference to FIGS. 7A to 10C.

The system for transferring a micro LED according to the second embodiment differs from the system for transferring a micro LED according to the first embodiment in that the system according to the second embodiment is configured such that the micro LED grip body 1000 is provided with an electroosmotic pump and grips the micro LEDs 100 according to the operation of the electroosmotic pump, whereas the system according to the first embodiment is configured such that the vacuum pump is operated to grip the micro LEDs 100.

The electroosmotic pump, abbreviated as EO pump, is a pump that moves a fluid by using an electroosmosis generated when voltage or electricity is applied to an electrode provided on or formed in the porous member 1100. The porous member 1100 is made of a porous material having pores in which a fluid flows, and opposite electrodes are connected to opposite sides thereof such that electroosmosis occurs.

The electroosmotic pump provided in the system for transferring a micro LED according to the second embodiment includes: a first electrode provided on a first surface of the porous member 1100; a second electrode provided on a second surface of the porous member 1100; and a power supply unit connected to the first and second electrodes to apply voltage.

The first and second electrodes are provided in a manner not to block the pores formed on the surface of the porous member 1100 so that the pores of the porous member 1100 allow the solution 2000 to flow into the chamber 1200 therethrough. The first and second electrodes may be formed on the surface of the porous member 1100 by sputter deposition.

Hereinbelow, the system for transferring a micro LED according to the second embodiment will be described in more detail with reference to FIGS. 7A to 7C.

Figure 7A:
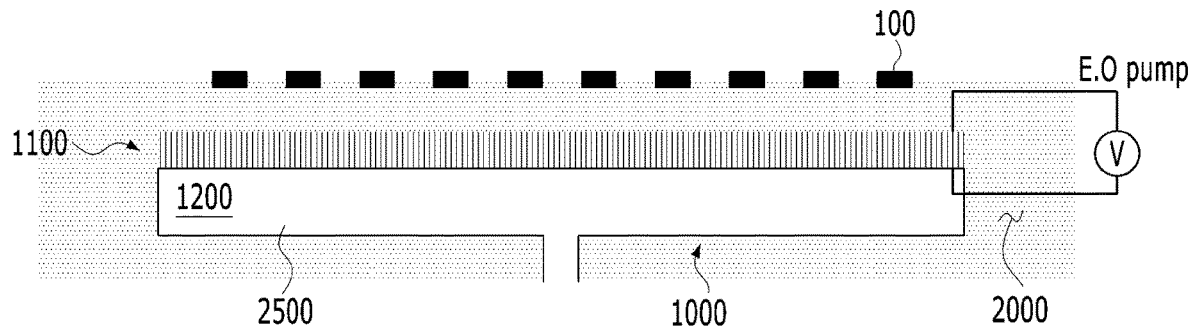
FIGS. 7A to 7C are views illustrating a system for transferring a micro LED according to a second embodiment of the present invention.

As illustrated in FIG. 7A, the micro LEDs 100 manufactured on the growth substrate 101 are dropped into the solution 2000. A pitch distance between the micro LEDs 100 dropped in the solution 2000 may be adjusted by controlling a flow rate of the solution 2000.

An electrolyte 2500 is filled in the chamber 1200 of the micro LED grip body 1000, and some of the electrolyte 2500 is filled up to a predetermined height of the pores. In other words, the electrolyte 2500 is provided in the pores in such manner that the top surface of the electrolyte 2500 does not reach the top surface of the pores. It is preferable that the electrolyte 2500 filled in the pores has a property that the electrolyte 2500 and the solution 2000 do not mix with each other. Due to such configuration, the solution 2000 does not flow into the pores when there is no external power.

Figure 7B:
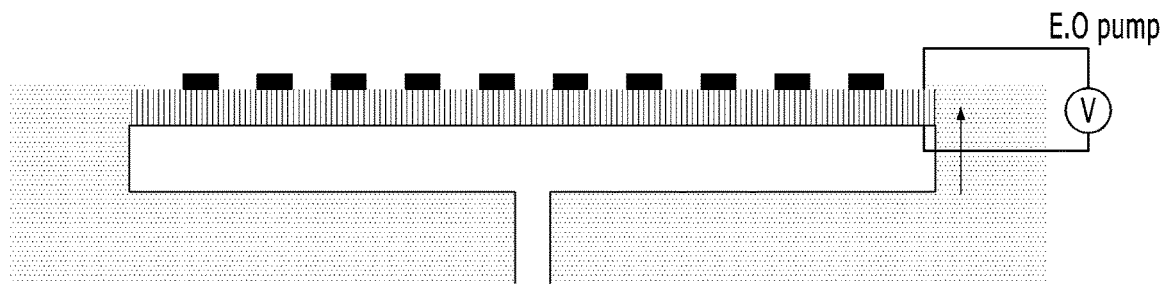

Next, as illustrated in FIG. 7B, the micro LED grip body 1000 is lifted to bring bottom surfaces of the micro LEDs 100 into close contact with the grip surface of the micro LED grip body 1000. Next, the electroosmotic pump is operated. The electroosmotic pump controls the flow of the electrolyte 2500 filled in the porous member 1100 so that the micro LED grip body 1000 grips the micro LEDs 100. The electroosmotic pump lowers the electrolyte 2500 filled in a part of the inside of the porous member 1100, thereby gripping the micro LEDs 100 by the vacuum suction force applied to the pores of the micro LED grip body 1000.

As described above, when the electroosmotic pump lowers the electrolyte 2500 filled in a part of the inside of the porous member 1100, it is possible to grip the micro LEDs 100 by the vacuum suction force on the upper surface of the porous member 1100.

Figure 7C:
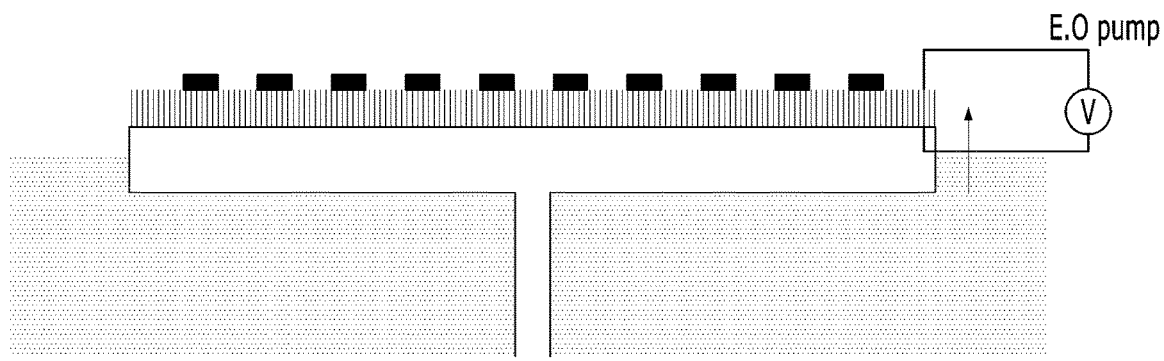

Next, as illustrated in FIG. 7C, the micro LED grip body 1000 is kept lifted up while gripping the micro LEDs 100 in order to expose the micro LEDs 100 to the outside of the solution 2000. The micro LED grip body 1000 grips and holds the micro LEDs 100 using the vacuum suction force until the micro LEDs 100 are transferred to the next process.

When the electrolyte 2500 filled in a part of the inside of the porous member 1100 is raised by operating the electroosmotic pump, the micro LEDs 100 gripped on the upper surface of the porous member 1100 are detached therefrom.

Hereinafter, a first modification of the system for transferring a micro LED according to the second embodiment will be described in detail with reference to FIGS. 8A to 8C.

The first modification of the system for transferring a micro LED according to the second embodiment differs from the system for transferring a micro LED according to the second embodiment with respect to the configuration. A micro LED grip body 1000 of the first modification of the system according to the second embodiment attracts the micro LEDs 100 floating in the solution 2000, whereas the micro LED grip body 1000 of the system of the second embodiment is lifted and brought in close contact with the micro LEDs 100.

Figure 8A:
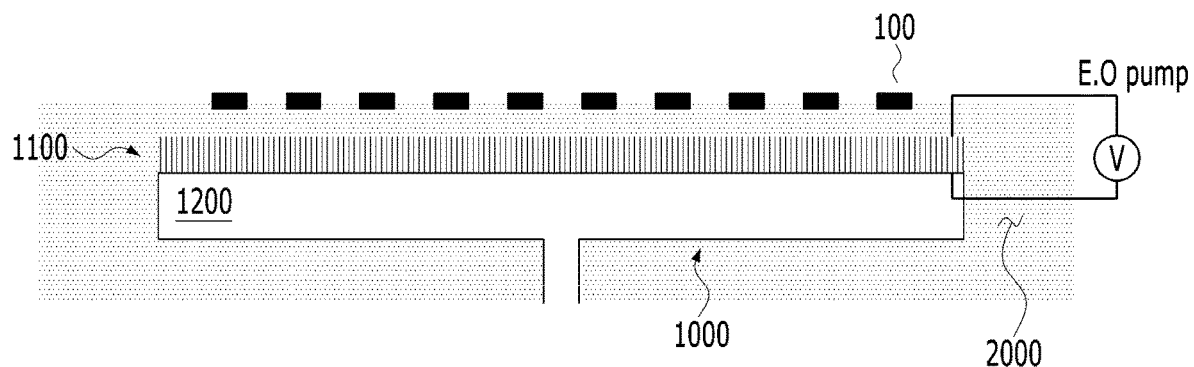
FIGS. 8A to 8C are views illustrating a first modification of the system for transferring a micro LED according to the second embodiment of the present invention.
Figure 8B:
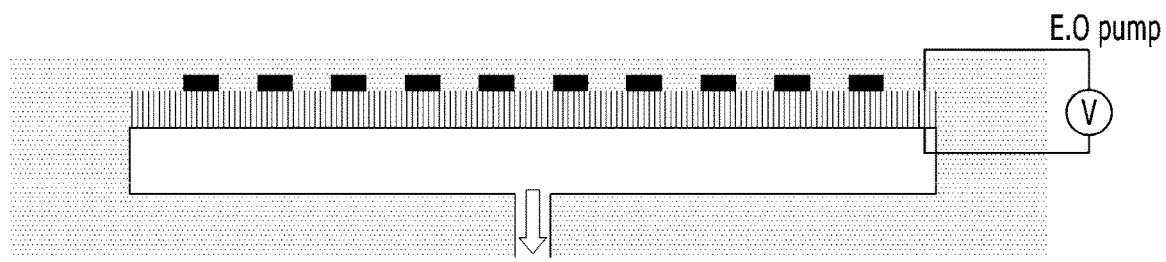
Figure 8C:
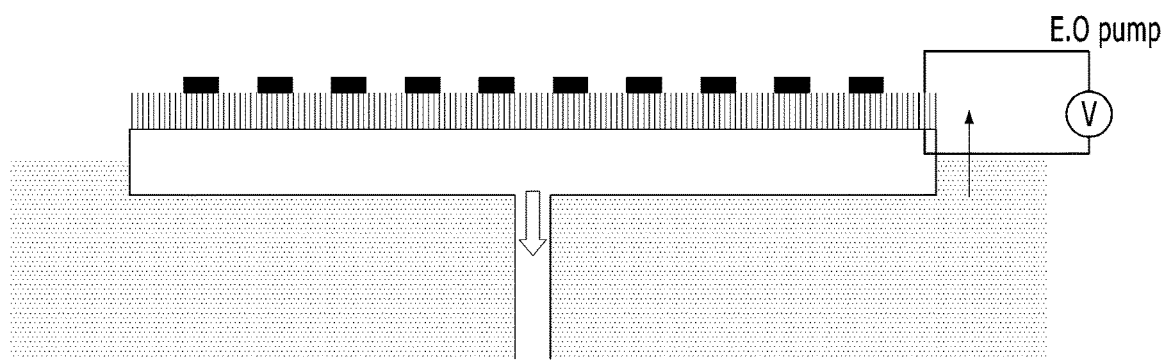

The first modification of the system for transferring a micro LED according to the second embodiment illustrated in FIGS. 8A to 8C has a property that the solution 2000 is involved in the operation of the electroosmotic pump. Therefore, when the electroosmotic pump is operated, the solution 2000 may flow into the chamber 1200 through the pores. In other words, the electroosmotic pump generates a flow in which the solution 2000 flows into the porous member 1100, thereby functioning to attract the micro LEDs 100 down to the grip surface of the micro LED grip body 1000.

As illustrated in FIG. 8A, the micro LEDs 100 manufactured on the growth substrate 101 are dropped into the solution 2000. A pitch distance between the micro LEDs 100 dropped in the solution 2000 may be adjusted by controlling a flow rate of the solution 2000.

Next, as illustrated in FIG. 8B, the electroosmotic pump is operated to allow the solution 2000 located above the porous member 1100 to flow into the chamber 1200 through the pores. Accordingly, a downward force is applied to the micro LEDs 100 floating in the solution 2000, and the micro LEDs 100 are attracted to the grip surface of the micro LED grip body 1000 by the downward force.

After that, the vacuum pump is operated to discharge the inside air to the outside through the chamber 1200, and the grip surface of the micro LED grip body 1000 grips the micro LEDs 100 by vacuum-suction. Here, some of the solution 2000 may flow into the chamber 1200, and the solution 2000 flowing into the chamber 1200 is discharged to the outside through a drain part (not illustrated).

Next, as illustrated in FIG. 8C, the micro LED grip body 1000 is kept lifted up while gripping the micro LEDs 100 in order to expose the micro LEDs 100 to the outside of the solution 2000. The micro LED grip body 1000 grips and holds the micro LEDs 100 using the vacuum suction force until the micro LEDs 100 are transferred to the next process.

Hereinafter, a second modification of the system for transferring a micro LED according to the second embodiment will be described in detail with reference to FIGS. 9A to 9C.

Figure 9A:
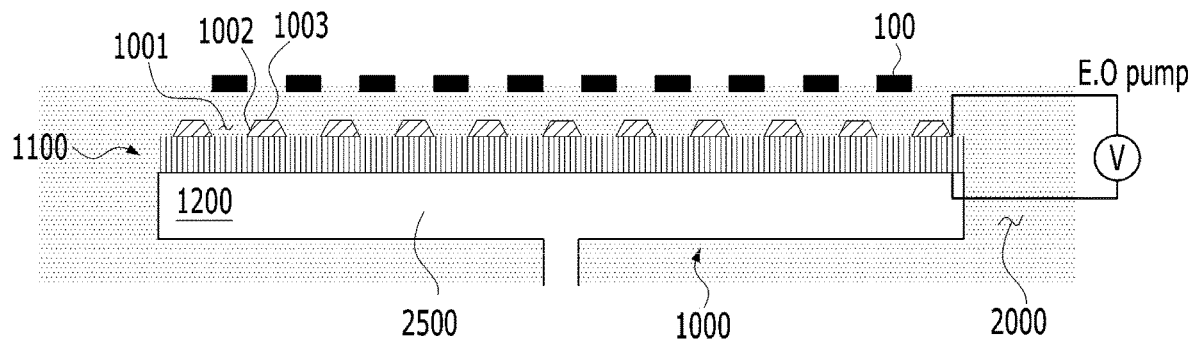
FIGS. 9A to 9C are views illustrating a second modification of the system for transferring a micro LED according to the second embodiment of the present invention.
Figure 9B:
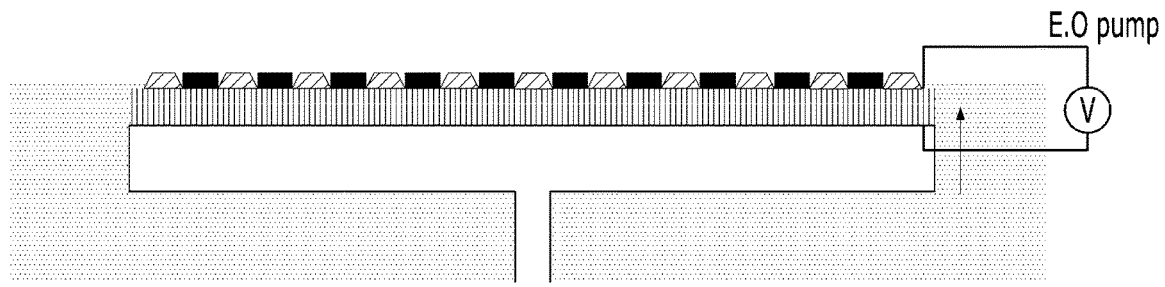
Figure 9C:
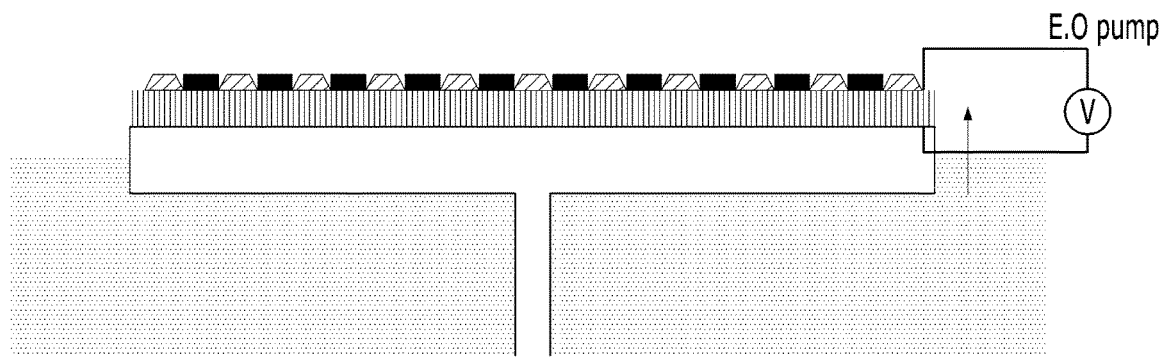

The second modification of the system for transferring a micro LED according to the second embodiment illustrated in FIGS. 9A to 9C differs from the system for transferring a micro LED according to the second embodiment illustrated in FIGS. 7A to 7C with respect to the configuration in which the upper surface of the porous member 1100 is configured with seating recesses 1001 having guide inclined portions 1002 on which the micro LEDs 100 are seated and configured with shielding portions 1003 provided around the seating recesses 1001, but other configurations are the same.

As illustrated in FIG. 9A, the micro LEDs 100 manufactured on the growth substrate 101 are dropped into the solution 2000. A pitch distance between the micro LEDs 100 dropped in the solution 2000 may be adjusted by controlling a flow rate of the solution 2000.

Next, as illustrated in FIG. 9B, the micro LED grip body 1000 is lifted to allow the micro LEDs 100 to enter into the seating recesses 1001. At this point, the guide inclined portions 1002 of the seating recesses 1001 guide the micro LEDs 100 to enter into the seating recesses 1001, and the micro LEDs 100 that have been disturbed in the solution 2000 are rearranged in a pitch distance of the seating recesses 1001.

Next, as illustrated in FIG. 9C, while the micro LEDs 100 are gripped by the vacuum suction force applied to the pores of the micro LED grip body 1000, the micro LED grip body 1000 is kept lifted to expose the micro LEDs 100 to the outside of the solution 2000.

Hereinafter, a third modification of the system for transferring a micro LED according to the second embodiment will be described in detail with reference to FIGS. 10A to 10C.

Figure 10A:
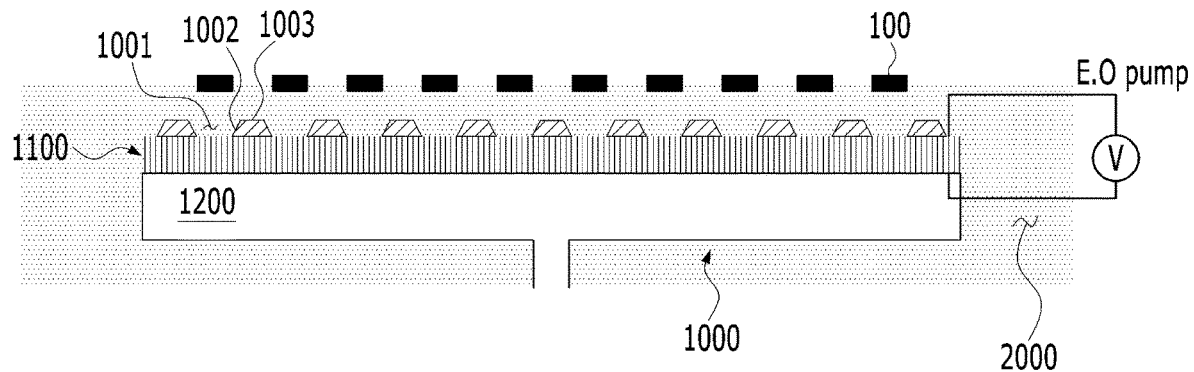
FIGS. 10A to 10C are views illustrating a third modification of the system for transferring a micro LED according to the second embodiment of the present invention.
Figure 10B:
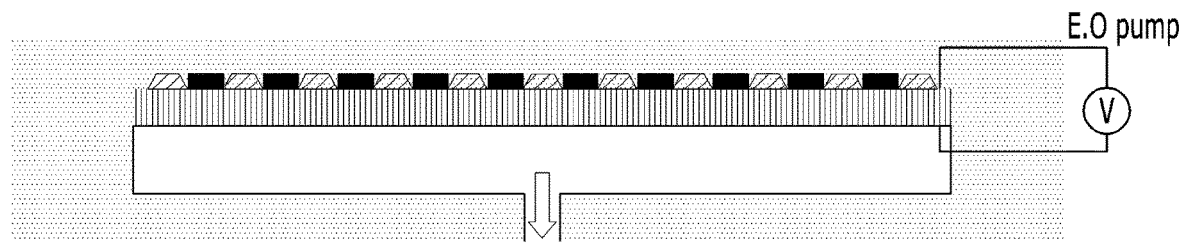
Figure 10C:
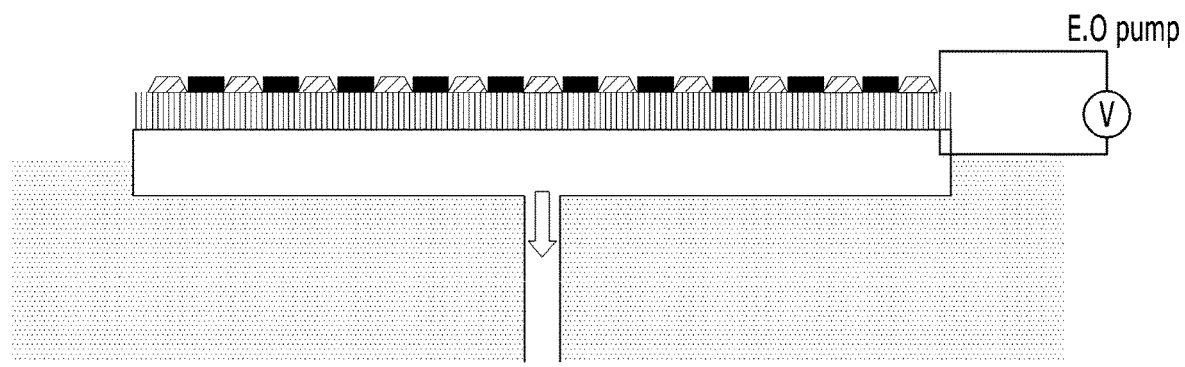

The third modification of the system for transferring a micro LED according to the second embodiment illustrated in FIGS. 10A to 10C differs from the first modification of the system for transferring a micro LED according to the second embodiment illustrated in FIGS. 8A to 8C with respect to the configuration in which the upper surface of the porous member 1100 is configured with seating recesses 1001 having guide inclined portions 1002 on which the micro LEDs 100 are seated and configured with shielding portions 1003 provided around the seating recesses 1001, but other configurations are the same.

As illustrated in FIG. 10A, the micro LEDs 100 manufactured on the growth substrate 101 are dropped into the solution 2000. A pitch distance between the micro LEDs 100 dropped in the solution 2000 may be adjusted by controlling a flow rate of the solution 2000.

Next, as illustrated in FIG. 10B, the electroosmotic pump is operated to allow the solution 2000 located above the porous member 1100 to flow into the chamber 1200 through the pores. Accordingly, a downward force is applied to the micro LEDs 100 floating in the solution 2000, and the micro LEDs 100 are attracted to the grip surface of the micro LED grip body 1000 by the downward force.

Figure 11A:
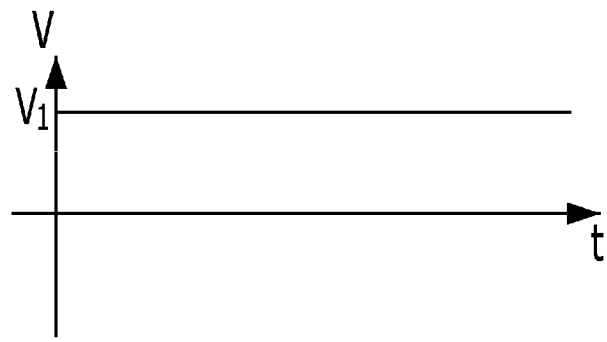
FIGS. 11A and 11B illustrate graphs of voltage applied to an electroosmotic pump of the system for transferring a micro LED according to the second embodiment of the present invention.
Figure 11B:
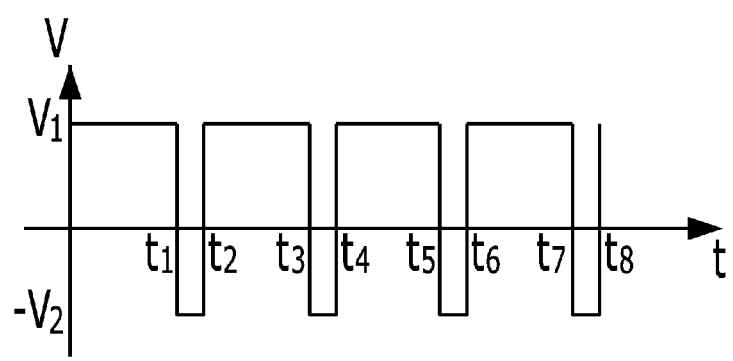

Here, the voltage of the electroosmotic pump may be constant voltage as illustrated in FIG. 11A or pulse-wave voltage as illustrated in FIG. 11B.

As illustrated in FIG. 11A, when applying the constant voltage to the electroosmotic pump, the fluid flows in only one direction. As a result, it is possible to attract the micro LEDs 100 more quickly.

Conversely, when the pulse-wave voltage is applied to the electroosmotic pump as illustrated in FIG. 11B, two fluid flows in opposite directions are generated. However, the absolute value of voltage $V_2$ is greater than the absolute value of voltage $V_1$, and the retention time of the voltage $V_2$ is longer than the retention time of the voltage $V_1$. Therefore, when viewed as a whole, the fluid flows downward in the one direction, and when the voltage $V_2$ is applied, the effect of impacting the fluid flowing in the one direction can be exerted.

When the electroosmotic pump is driven by pulse-wave voltage, both the downward flow and the upward flow of the solution 2000 occur simultaneously. However, the flow of the solution 2000 is controlled in a manner that the downward flow of the solution 2000 is larger than the upward flow of the solution 2000, and an upward shock wave is given to the micro LEDs 100 at regular intervals. Accordingly, it is possible to attract the micro LEDs 100 to the bottom surface of the seating recesses 1001 more easily along the guide inclined portions 1002. In other words, during the process of the downward movement of the micro LEDs 100 by the electroosmotic pump, even when the micro LEDs 100 are staggered on the guide inclined portions 1002, it is possible to shift the micro LEDs 100 out of the misaligned position by applying the upward flow in the middle and guide the micro LEDs into the seating recesses 1001.

At this point, the guide inclined portions 1002 of the seating recesses 1001 guide the micro LEDs 100 to enter into the seating recesses 1001, and the micro LEDs 100 that have been disturbed in the solution 2000 are rearranged in a pitch distance of the seating recesses 1001.

After that, the vacuum pump is operated to discharge the inside air to the outside through the chamber 1200, and the grip surface of the micro LED grip body 1000 grips the micro LEDs 100 by vacuum-suction. Here, some of the solution 2000 may flow into the chamber 1200, and the solution 2000 flowing into the chamber 1200 is discharged to the outside through a drain part (not illustrated).

Next, as illustrated in FIG. 10C, the micro LED grip body 1000 is kept lifted up while gripping the micro LEDs 100 in order to expose the micro LEDs 100 to the outside of the solution 2000.

Examples of Porous Member

Figure 12:
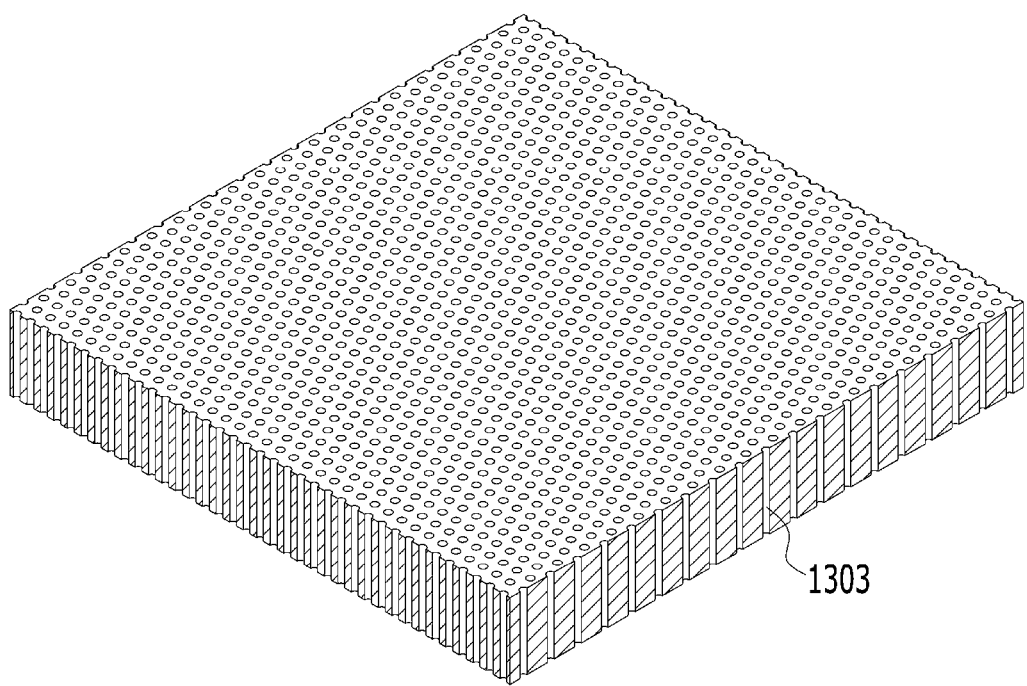
FIGS. 12 to 20 are views illustrating examples of a porous member of the first and second embodiments of the present invention.

FIG. 12 is a view illustrating an example of the porous member of the first and second embodiments of the present invention.

As illustrated in FIG. 12, the porous member may be an anodic oxide film 1300 having pores formed by anodizing a metal.

The anodic oxide film 1300 is a film formed by anodizing a metal that is a base material, and pores 1303 are pores formed in a process of forming the anodic oxide film 1300 by anodizing the metal. For example, in a case that the base metal is aluminum (Al) or an aluminum alloy, the anodization of the base material forms the anodic oxide film 1300 consisting of anodized aluminum ($Al_2O_3$) on a surface of the base material. The anodic oxide film 1300 formed as described above includes a barrier layer in which the pores 1303 are not formed and a porous layer in which the pores 1303 are formed inside. The barrier layer is positioned on an upper portion of the base material, and the porous layer is positioned on the barrier layer 1301. After removing the base material on which the anodic oxide film 1300 having the barrier layer and the porous layer is formed, only anodic oxide film 1300 consisting of anodized aluminum ($Al_2O_3$) remains.

The anodic oxide film 1300 has the pores 1303 configured vertically and having a regular arrangement with a uniform diameter. Accordingly, after removing the barrier layer 1301, the pores 1303 have a structure extending from top to bottom vertically, thereby facilitating the generation of the vacuum pressure in the vertical direction.

The inside of the anodic oxide film 1300 forms a flow path vertically by the vertical pores 1303. An internal width of the pores 1303 has a size of several nanometers to several hundred nanometers. For example, when a size of the micro LED to be vacuum-sucked is 30 μm×30 μm and an internal width of the pores 1303 is several nanometers, it is possible to vacuum-suck the micro LEDs 100 by approximately tens of millions of pores 1303. When a size of the micro LED to be vacuum-sucked is 30 μm×30 μm and an internal width of the pores 1303 is several hundred nanometers, it is possible to vacuum-suck the micro LEDs 100 by approximately tens of thousands of pores 1303. The micro LEDs 100 are lightweight because each of the micro LEDs 100 are fundamentally configured with the first semiconductor layer 102, the second semiconductor layer 104, the active layer 103 provided between the first semiconductor layer 102 and the second semiconductor layer 104, the first contact electrode 106, and the second contact electrode 107. Accordingly, it is possible to grip the micro LEDs 100 by tens of thousands to tens of millions of pores 1303 formed in the anodic oxide film 1300 by vacuum-suction.

Figure 13:
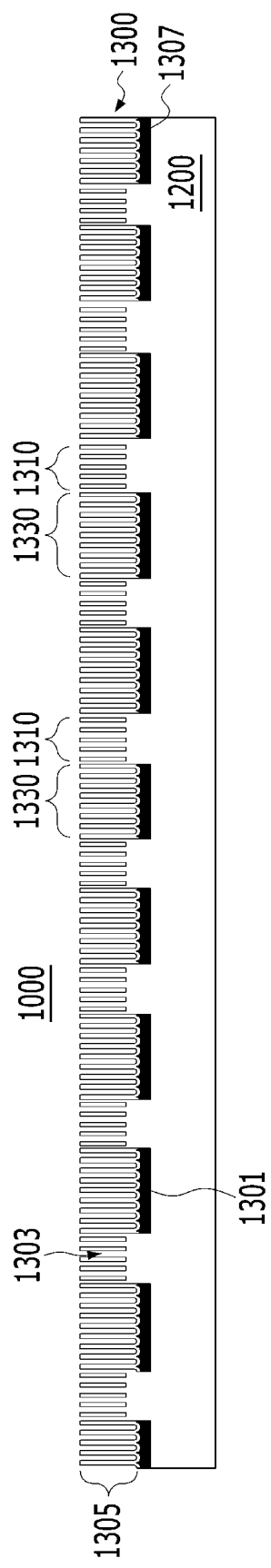

FIG. 13 is a view illustrating another example of the porous member of the first and second embodiments of the present invention. The porous member illustrated in FIG. 13 is configured such that a supporting port ion 1307 is further provided on a non-suction region 1330 to reinforce the strength of the anodic oxide film 1300. For example, the supporting portion 1307 may be a metal base material. The metal base material used for the anodization is not removed and left on the barrier layer 1301 such that the metal base material may serve as the supporting portion 1307. Referring to FIG. 13, the non-suction region 1330 is configured with the supporting portion 1307 made of the metal base material, the barrier layer 1301, and the porous layer 1305 having the pores 1303. As the supporting portion 1307 made of the metal base material and the barrier layer 1301 are removed, a suction region 1310 is formed in a manner that the upper and lower portions of the pores 1303 extend from top to bottom. The supporting portion 1307 made of the metal base material is provided in the non-suction region 1330 to secure the strength of the anodic oxide film 1300. As the strength of the anodic oxide film 1300 which has a relatively weak strength is increased due to the above-described configuration of the supporting portion 1307, it is possible to configure the micro LED grip body 1000 having the anodic oxide film 1300 according to the first and second embodiments to have a large area.

Figure 14:
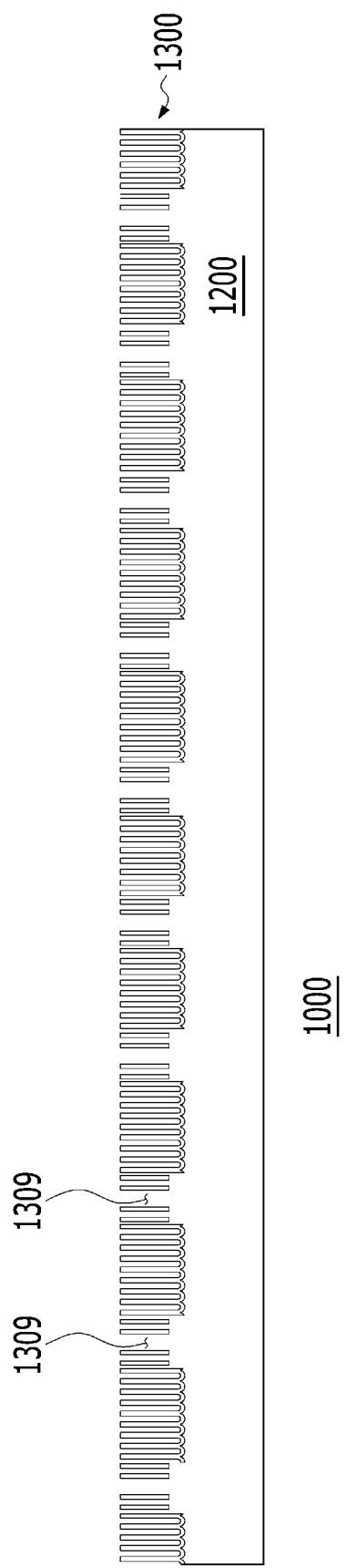

FIG. 14 is a view illustrating still another example of the porous member of the first and second embodiments of the present invention. The micro LED grip body 1000 illustrated in FIG. 14 is configured such that a through-hole 1309 is further provided in the suction region 1310 of the anodic oxide film 1300 in addition to the pores 1303 which are formed spontaneously in the anodic oxide film 1300. The through-hole 1309 is configured to extend from top to bottom of the anodic oxide film 1300 longitudinally. A diameter of the through-hole 1309 is configured to be larger than those of the pores 1303. The through-hole 1309 may be formed by etching the anodic oxide film 1300 vertically after forming the anodic oxide film 1300 and the pores 1303.

Figure 15:
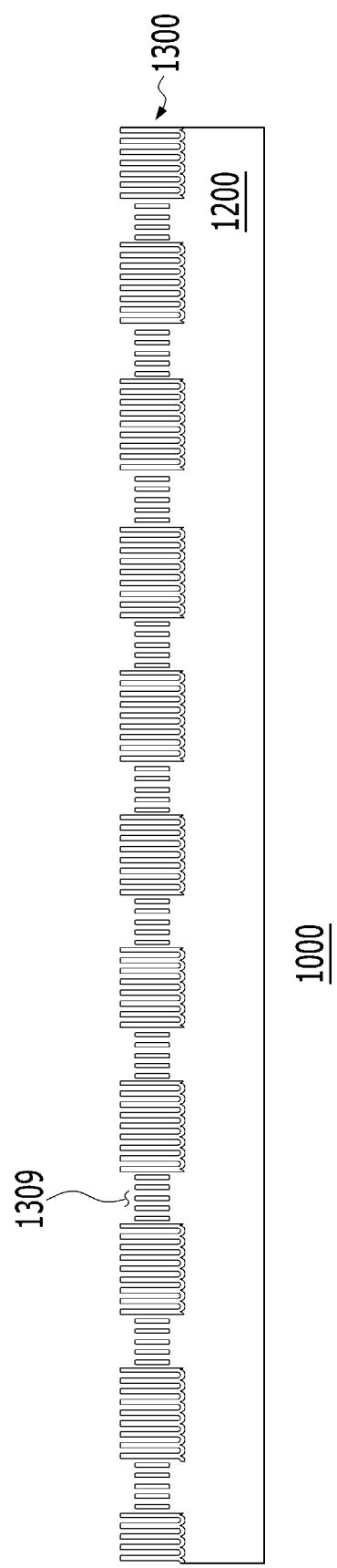

FIG. 15 is a view illustrating yet another example of the porous member of the first and second embodiments of the present invention. As illustrated in FIG. 15, the micro LED grip body 1000 is configured such that an extended recess 1309 is further provided in a lower portion of the suction region 1310 of the anodic oxide film 1300. The extended recess 1309 has a horizontal area larger than that of the above-described pores 1303 or the through-hole 1309 of FIG. 14, but smaller than that of the upper surface of the micro LED 100. The extended recess 1309 may be formed by etching a part of the anodic oxide film 1300 to a predetermined depth after forming the anodic oxide film 1300 and the pores 1303.

Figure 16:
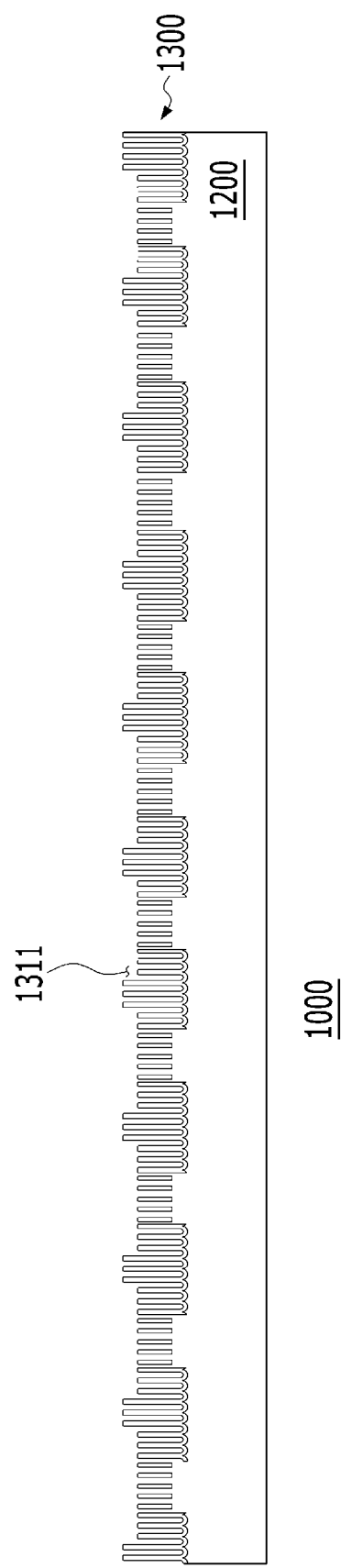

FIG. 16 is a view illustrating a further example of the porous member of the first and second embodiments of the present invention. As illustrated in FIG. 16, the micro LED grip body 1000 is configured such that a receiving recess 1311 is further provided in a lower portion of the suction region 1310 of the anodic oxide film 1300. The receiving recess 1311 has a horizontal area larger than that of the upper surface of the micro LED 100. The receiving recess 1311 may be formed by etching a part of the anodic oxide film 1300 to a predetermined depth after forming the anodic oxide film 1300 and the pores 1303.

Figure 17:
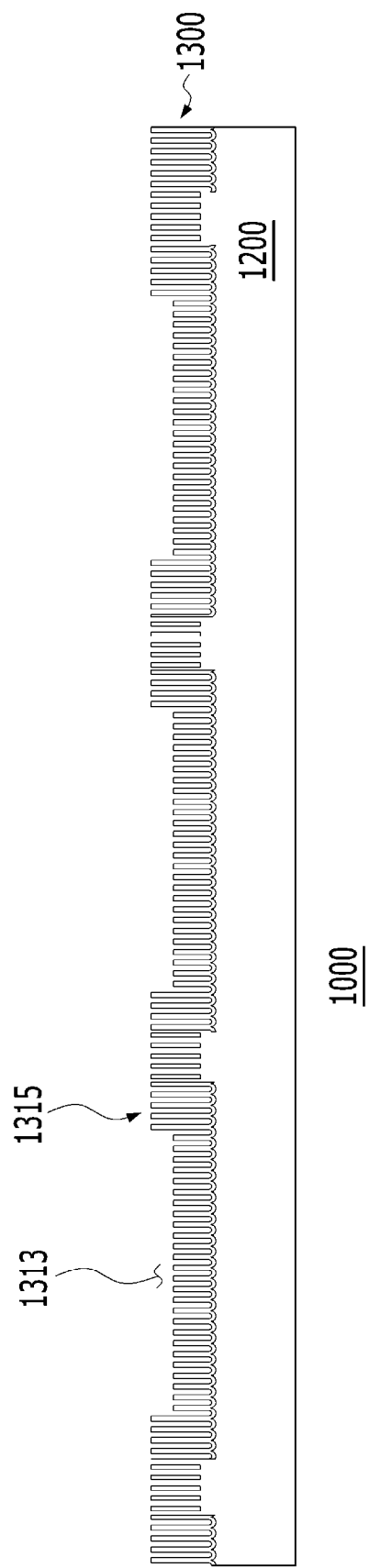

FIG. 17 is a view illustrating a further example of the porous member of the first and second embodiments of the present invention. As illustrated in FIG. 17, the micro LED grip body 1000 is configured such that an escape recess 1313 is further provided in an upper portion of the non-suction region 1330 of the anodic oxide film 1300. When the micro LED grip body 1000 descends to vacuum-suck the micro LEDs 100 at a predetermined position, column, or row, the escape recess 1313 functions to prevent interference of the micro LEDs 100 which are not to be gripped. Due to the configuration of the escape recess 1313, a protruding portion 1315 is provided in an upper portion of the suction region 1310. The protruding portion 1315 protrudes further upward in the vertical direction compared with the escape recess 1313, and the micro LED 100 is gripped at an upper portion of the protruding portion 1315. A horizontal area of the escape recess 1313 is configured to be larger than that of at least one micro LED 100. FIG. 17 illustrates that the escape recess 1313 has a horizontal width equal to a value obtained by summing twice the horizontal width of the two micro LEDs 100 and twice the horizontal pitch distance between the micro LEDs 100. Thus, when the micro LED grip body 1000 is descended to grip the micro LEDs 100 to be gripped, it is possible to prevent interference of the micro LEDs 100 which are not to be gripped.

Figure 18:
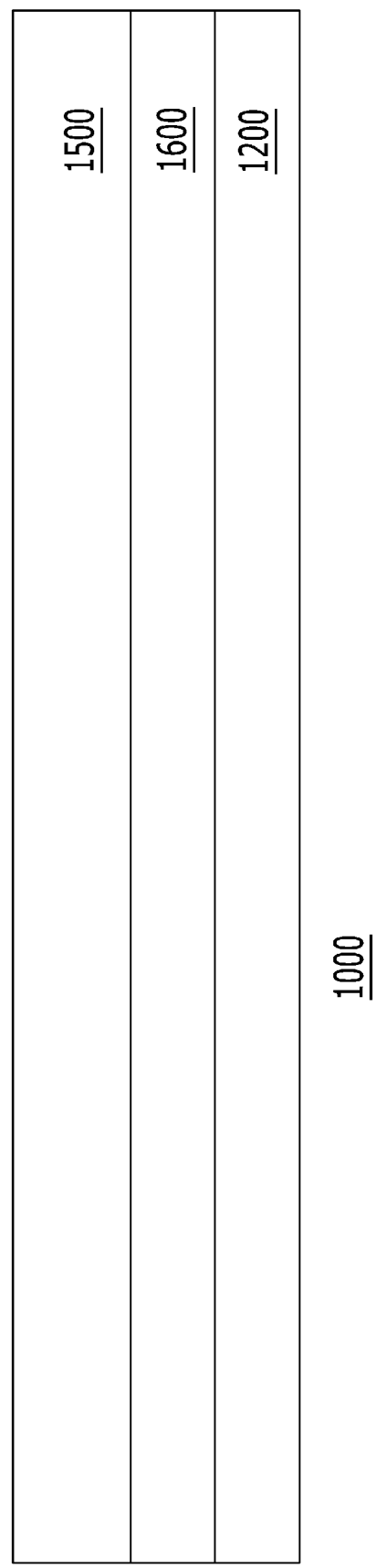
Figure 19:
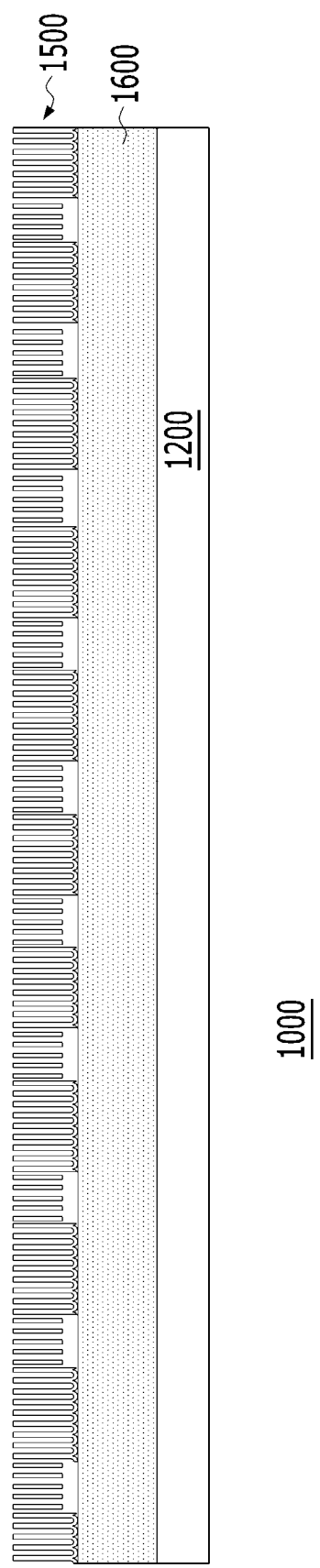

FIGS. 18 and 19 are views illustrating a further example of the porous member of the first and second embodiments of the present invention.

A first porous member 1500 is provided on a second porous member 1600. The first and second porous members 1500 and 1600 may have different porosity characteristics. For example, the first and second porous members 1500 and 1600 have different characteristics in the arrangement and size of the pores, the material and the shape of the porous member.

With respect to the arrangement of the pores, one of the first and second porous members 1500 and 1600 may have a uniform arrangement of pores and the other may have a disordered arrangement of pores. With respect to the size of the pores, any one of the first and second porous members 1500 and 1600 may have a larger pore size than the other. Here, the size of the pores may be the average size of the pores or may be the maximum size of the pores. With respect to the material of the porous member, one of the first and second porous members may be formed of one of organic, inorganic (ceramic), metal, and hybrid type porous materials, and the other one may be formed of one of organic, inorganic (ceramic), metal, and or hybrid type porous material different from the first material. In terms of the shape of the porous member, the first and second porous members 1500 and 1600 may have different shapes.

By varying the arrangement, size, material, and shape of the pores of the first and second porous members 1500 and 1600 as described above, the micro LED grip body 1000 has various functions and each of the first and second porous members 1500 and 1600 performs complementary functions. The number of the porous members is not limited to two as in the case of the first and second porous members. As long as individual porous members have mutually complementary functions, providing two or more porous members also falls into the scope of this example of the porous member.

Referring to FIG. 19, the first porous member 1500 may be embodied by an anodic oxide film 1300 having pores formed by anodizing a metal. The second porous member 1600 may be embodied by a rigid porous scaffold capable of preventing sagging at the center portion of the first porous member 1500. For example, the second porous member 1600 may be made of a porous ceramic material.

Figure 20:
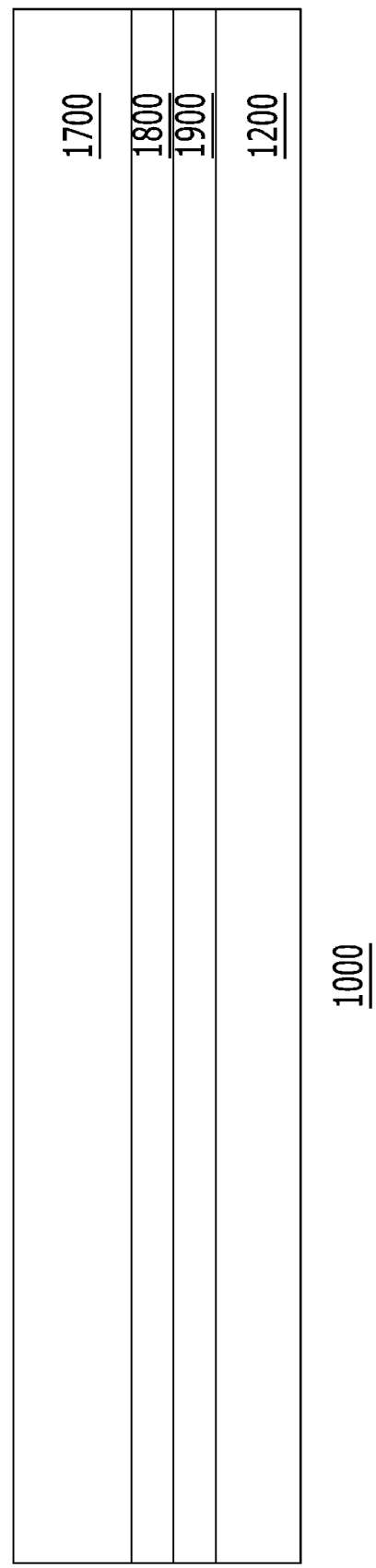

FIG. 20 is a view illustrating a further example of the porous member of the first and second embodiments of the present invention. In this example of the porous member, the porous member 1100 is constituted by three porous members including a first porous member 1700, a second porous member 1800, and a third porous member 1900.

The first porous member 1700 is provided on the second porous member 1800, and the second porous member 1800 is provided on the third porous member 1900. The first porous member 1700 functions to vacuum-suck the micro LEDs 100. At least one of the second porous member 1800 and the third porous member 1900 may be embodied by a rigid porous scaffold, and the remaining one of the second porous member 1800 and the third porous member 1900 may be embodied by a soft porous buffer.

With the above structure, it is possible to vacuum-suck the micro LEDs, prevent the sagging at the center portion of the first porous member 1700, and prevent damage to the micro LEDs 100.

According to the embodiments of the present invention, the following effects can be obtained.

The micro LED grip body 1000 grips and transfers the micro LEDs 100 dropped in the solution 2000 using the vacuum suction force, whereby an additional transfer force of the micro LED grip body 1000 for gripping the micro LEDs 100 is not required.

It is possible to correct the alignment of the micro LEDs 100 dropped in the solution 2000 due to the seating recesses 1001 provided in the micro LED grip body 1000.

It is possible to attract the micro LEDs 100 to the grip surface more easily by using the electroosmotic pump provided in the micro LED grip body 1000.

Before the micro LEDs 100 are dropped into the solution 2000, product testing is performed so that only the normal micro LEDs 100 can be dropped into the solution 2000, excluding defective products. With the configuration in which only the normal micro LEDs 100 are dropped into the solution 2000 as described above, the micro LED grip body 1000 can grip and transfer only the normal micro LEDs 100, whereby it is possible to omit a complicated process of selectively removing defective micro LEDs 100 among the micro LEDs 100 mounted on the display substrate 300 and then replacing the defective micro LEDs 100 with the normal micro LEDs 100. Accordingly, the process of transferring the micro LEDs 100 can be performed more efficiently.

As described above, the present invention has been described with reference to the embodiments. However, those skilled in the art will appreciate that various modifications, additions and substitutions are possible, without departing from the scope and spirit of the invention as disclosed in the accompanying claims.

What is claimed:

1. A system for transferring a micro LED, the system comprising:
   a micro LED dropped into a solution; and
   a micro LED grip body immersed in the solution, including a porous member having pores, and gripping the micro LED with a grip surface where the pores are provided,
   wherein an upper surface of the porous member is configured with a seating recess having a guide inclined portion on which the micro LED is mounted and a shielding portion provided around the seating recess.

2. The system of claim 1, wherein the micro LED grip body grips the micro LED with a suction force applied to the pores.

3. The system of claim 2, wherein the micro LED grip body is lifted such that the grip surface is brought into close contact with the micro LED and the micro LED is gripped by the suction force.

4. The system of claim 2, wherein the micro LED dropped in the solution is lowered by the suction force of the micro LED grip body such that the micro LED is attracted to the grip surface of the micro LED grip body.

5. The system of claim 1, wherein the micro LED grip body is provided with an electroosmotic pump such that the micro LED grip body grips the micro LED according to operation of the electroosmotic pump.

6. The system of claim 5, wherein the electroosmotic pump includes:
    a first electrode provided on a first surface of the porous member;
    a second electrode provided on a second surface of the porous member; and
    a power supply unit connected to the first and second electrodes to apply voltage.

7. The system of claim 5, wherein the electroosmotic pump generates a flow in which the solution flows into the porous member, thereby attracting the micro LED to the grip surface of the micro LED grip body.

8. The system of claim 5, wherein the electroosmotic pump controls a flow of an electrolyte filled in the porous member so that the micro LED grip body grips the micro LED.

9. The system of claim 5, wherein the electroosmotic pump is driven by a pulse wave.

10. The system of claim 9, wherein the pulse wave is controlled such that a downward force of the solution is larger than an upward force of the solution.

11. The system of claim 1, wherein the porous member includes a porous ceramic.

12. The system of claim 1, wherein the porous member includes an anodic oxide film.

* * * * *